(12) United States Patent
Johnson et al.

(10) Patent No.: US 6,679,978 B2
(45) Date of Patent: Jan. 20, 2004

(54) METHOD OF MAKING SELF-CLEANING SUBSTRATES

(75) Inventors: Herb Johnson, Kingsport, TN (US); Mark Ford, Kingsport, TN (US)

(73) Assignee: AFG Industries, Inc., Kingsport, TN (US)

( * ) Notice: Subject to any disclaimer, the term of this patent is extended or adjusted under 35 U.S.C. 154(b) by 14 days.

(21) Appl. No.: 10/079,454

(22) Filed: Feb. 22, 2002

(65) Prior Publication Data

US 2003/0162033 A1 Aug. 28, 2003

(51) Int. Cl.$^7$ ............................ C23C 14/34; C23C 8/00; B05D 3/06; A61N 5/00
(52) U.S. Cl. ........................ 204/192.22; 204/192.12; 427/585; 427/558; 427/419.2; 250/492.1
(58) Field of Search ................. 204/192.12, 192.15, 204/192.22; 427/585, 558, 419.2; 250/492.1; 428/426

(56) References Cited

U.S. PATENT DOCUMENTS

| | | | |
|---|---|---|---|
| 5,165,972 A | 11/1992 | Porter | 428/1 |
| 5,830,252 A | 11/1998 | Finley et al. | 65/60.5 |
| 5,853,866 A | 12/1998 | Watanabe et al. | 428/312.8 |
| 5,939,194 A | 8/1999 | Hashimoto et al. | 428/411.1 |
| 6,013,372 A | 1/2000 | Hayakawa et al. | 428/411.1 |
| 6,027,766 A | 2/2000 | Greenberg et al. | 427/226 |
| 6,027,797 A | 2/2000 | Watanabe et al. | 428/312.8 |
| 6,037,289 A | 3/2000 | Chopin et al. | 502/2 |
| 6,054,227 A | 4/2000 | Greenberg et al. | 428/701 |
| 6,090,489 A | 7/2000 | Hayakawa et al. | 428/409 |
| 6,103,363 A | 8/2000 | Boire et al. | 428/325 |
| 6,165,256 A | 12/2000 | Hayakawa et al. | 106/13 |
| 6,191,062 B1 | 2/2001 | Hayakawa et al. | 502/159 |
| 6,210,779 B1 | 4/2001 | Watanabe et al. | 428/208 |
| 6,238,738 B1 | 5/2001 | McCurdy | 427/255.19 |
| 6,294,247 B1 | 9/2001 | Watanabe et al. | 428/312.8 |

FOREIGN PATENT DOCUMENTS

| | | |
|---|---|---|
| EP | 0 071 865 B1 | 2/1983 |
| EP | 0 590 477 A1 | 4/1994 |
| EP | 0 737 513 A1 | 10/1996 |
| EP | 0 816 466 A1 | 1/1998 |
| EP | 0 901 991 A2 | 3/1999 |
| JP | 53-149281 | 12/1978 |
| JP | 63-100042 | 5/1988 |
| JP | 7-99425 | 4/1995 |
| JP | 7-117600 | 12/1995 |
| WO | WO 95/11751 | 5/1995 |
| WO | WO 97/07069 | 2/1997 |
| WO | WO 98/06675 | 2/1998 |
| WO | WO 98/41480 | 9/1998 |
| WO | WO 00/75087 A1 | 12/2000 |

OTHER PUBLICATIONS

Ollis, David F., "Heterogeneous photocatalysis". Cattech, Baltzer Science Publishers, vol. 2 (Dec. 1998) pp. 149–157.
Weinberger, B.R., and Garber, R.B., "Titanium dioxide photocatalysts produced by reactive magnetron sputtering". Appl. Phys. Lett. 66 (18), American Institute of Physics, (May 1995), pp. 2409–2411.
Watanabe, Toshiya, et al., "Photocatalytic Activity of $TiO_2$ Thin Film under Room Light". Photocatalytic Purification and Treatment of Water and Air, Elsevier Science Publishers B.V., (1993), pp. 747–751.
Negishi, Nobuaki, et al., "Preparation of Transparent $TiO_2$ Thin Film Photocatalyst and Its Photocatalytic Activity". Chemistry Letters, (1995), pp. 841–842.
Vinodgopal, K, and Prashant, V. Kamat, "Electrochemically assisted photocatalysis using nanocrystalline semiconductor thin films", Solar Energy Materials and Solar Cells, 38 (1995), Elsevier Science B.V., pp. 401–410.
Lassaletta, A. Fernandez, et al., "Spectroscopic Characterization of Quantum–Sized $TiO_2$ Supported on Silica: Influence of Size and $TiO_2$–$SiO_2$ Interface Composition". J. Phys. Chem. 1995, 99, American Chemical Society, (1995), pp. 1484–1490.
Chaissac, Martine, et al., "Behavior of rf sputter deposited $SiO_2$ and $Al_2O_3$ diffusion barriers on float glass at 300° C in air", Glastech. Ber. 66 (1993) Nr. 12, pp. 331–333.
Takahashi, Masanari, et al., "Pt–$TiO_2$ thin films on glass substrates as efficient photocatalysts", Journal of Materials Science, vol. 24 (1989), pp. 243–246.
Fukuyama, S., et al., "Highly Transparent and Photoactive $TiO_2$ Thin Film Coated on Glass Substrate", 187$^{th}$ Electrochemical Society Meeting, May 1995, Extended Abstracts 95–1, Abstract 735, p. 1102–1103.
Kiernan, Vincent, "A clearer view for car drivers". New Scientist, (Aug. 1995), pp. 19.
Paz, Y., and Luo, Z., "Photooxidative self–cleaning transparent titanium dioxide films on glass", Materials Research Soc., J. Materials Research, vol. 10, No. 11, Nov. 1995, pp. 2842–2848.
JP 11–153 701 English Abstract.
JP 2001–26070 English Abstract.
EP 684075 English Abstract.
WO 9629375 English Abstract.
WO 9613327 English Abstract.
WO 9710186 English Abstract.
CN 1267644 English Abstract.

*Primary Examiner*—Steven H. VerSteeg
(74) *Attorney, Agent, or Firm*—Oblon, Spivak, McClelland, Maier & Neustadt, P.C.

(57) ABSTRACT

A photocatalytically-assisted self-cleaning ("PASC") coating on a substrate enables the substrate to shed dirt simply by rinsing with water. A method of making a PASC coating includes depositing by chemical vapor deposition an alkali metal diffusion barrier layer on a substrate; sputtering an ultraviolet radiation activated layer on the alkali metal diffusion barrier layer at a temperature of 100° C. or less; and, without heating above 100° C., exposing the ultraviolet radiation activated layer to ultraviolet radiation to form the self-cleaning substrate. The sputter deposition of the ultraviolet radiation activated layer on the chemical vapor deposited alkali metal diffusion barrier layer allows the ultraviolet radiation activated layer to be activated upon exposure to UV radiation without first having been heated during and/or after deposition. The elimination of this step of heating the ultraviolet radiation activated layer results in significant process simplification and cost reduction.

23 Claims, 7 Drawing Sheets

METHOD OF MAKING SELF-CLEANING SUBSTRATES

BACKGROUND OF THE INVENTION

1. Field of the Invention

This invention relates to articles with self-cleaning coatings. In particular, this invention relates to methods of making photocatalytically-activated self-cleaning ("PASC") coatings on substrates.

2. Discussion of the Background

For both practical and aesthetic reasons, it is often desirable to prevent the buildup of organic and inorganic contamination (i.e., "dirt") on surfaces. Many techniques have been developed over the years to "clean" surfaces by removing accumulations of dirt. Long ago it was discovered that most inorganic dirt can be washed away by applying water to a surface. The addition of soap to water has been found to remove most organic dirt as well.

However, cleaning articles by washing with soap and water is a time consuming process. Even careful washing can leave behind unacceptable amounts of dirt on surfaces of transparent substrates, such as glass, that can interfere with visibility.

Recently, PASC coatings have been developed that, after activation by exposure to ultraviolet (UV) radiation, promote the self-cleaning of coated articles upon rinsing with water. With such coatings, exterior glass surfaces can be cleaned simply by exposure to rain.

The ability of PASC coatings to shed dirt upon exposure to water is currently the subject of intense research. Upon activation by exposure to UV radiation, PASC coatings appear to function both photocatalytically and hydrophilically to remove dirt. Via a photocatalytic effect, the PASC coating causes the bonding of dirt to the coated substrate to break down. Via a hydrophilic effect, the PASC coating increases the ability of water to wet the PASC coating and to slip between dirt and the PASC coating to lift away the dirt.

Activated PASC coatings are characterized as being "superhydrophilic" as a result of the extremely low contact angle between water and the PASC coating. The contact angle of water with inorganic materials, such as glass, is generally 20–40 degrees. The contact angle of water with typical organic materials, such as resins, is 70–90 degrees. The contact angle of water with hydrophobic resins, such as silicone resin and fluorocarbon polymers, is more than 90 degrees. In contrast, the contact angle of UV activated PASC coatings is less than 20 degrees, and often less than 10 degrees, indicative of the propensity of water to spread out over an activated PASC coating. UV irradiation of a PASC coating can cause the water contact angle to approach zero.

The low contact angle of water on an activated PASC coating, in addition to promoting the removal of dirt, reduces the occurrence of water droplets such as fog on the PASC coating. In addition, because water spread out in a film has more surface area than a droplet, water evaporates from a PASC coating faster than from a conventional, non-superhydrophilic, surface.

U.S. Pat. No. 6,027,766 discloses the formation of PASC films of, preferably, titanium oxide by chemical vapor deposition, spray pyrolysis or magnetron sputtering on glass substrates. The '766 patent discloses that in the chemical vapor deposition and spray pyrolysis processes, the substrate is heated to above about 400° C. to cause metal-containing precursors to decompose and form a PASC coating on the substrate. In the sputtering process, the '766 patent discloses that during or after coating a substrate the substrate is heated to about 400 to about 600° C. to form the PASC coating.

U.S. Pat. No. 6,103,363 discloses "dirt-repellent" semi-conductive metal oxide coatings, such as titanium oxide, on glass substrates. The '363 patent discloses that the titanium oxide coatings are obtained by decomposition of titanium precursors by liquid pyrolysis, powder pyrolysis, and pyrolysis in the vapor phase (e.g., chemical vapor deposition). The titanium oxide coatings are also obtained by sol-gel techniques and by vacuum techniques such as reactive or non-reactive cathodic sputtering. The '363 patent recommends subjecting a coating with a photocatalytic property, after deposition, to an annealing heat treatment to improve the degree of crystallization of the coating.

However, post-deposition heat treatments to crystallize PASC coatings are time-consuming and expensive. Furthermore, excessive and/or prolonged heat treatment can adversely affect the PASC coating as well as the quality of the substrate on which the PASC coating is deposited. The photocatalytic and self-cleaning activity of a PASC coating can be significantly reduced or destroyed by the presence of small amounts of alkali metal ions such as sodium. These ions can diffuse during annealing heat treatments into the PASC coating from a substrate such as a soda-lime glass. Sodium ions may inhibit or destroy the photocatalytic activity of a $TiO_2$ PASC coating.

To prevent alkali metal ion diffusion into a PASC coating from a substrate, diffusion barriers have been introduced between the substrate and the PASC coating. Alkali metal ion diffusion barriers are particularly necessary when post-deposition annealing heat treatments are used to form PASC coatings.

There is a need for a method of making a UV activated PASC coating that does not require heating, during or after deposition, to form an effective self-cleaning surface.

SUMMARY OF THE INVENTION

The present inventors have discovered that activated PASC coatings with self-cleaning characteristics can be made, surprisingly, without conventional heat treatments during and/or after deposition, if the PASC coating is made by sputtering an ultraviolet radiation activated layer onto an alkali metal diffusion barrier layer deposited on a substrate by chemical vapor deposition ("CVD"). Because the ultraviolet radiation activated layer is not intentionally heated during or after the sputtering, significant process simplification and cost reduction can be achieved.

BRIEF DESCRIPTION OF THE DRAWINGS

The preferred embodiments of this invention will be described in detail with reference to the following figures.

DETAILED DESCRIPTION OF PREFERRED EMBODIMENTS

The present invention provides a method of manufacturing a PASC coating on a substrate which eliminates the heat treatments conventionally used during and/or after deposition to crystallize an ultraviolet radiation activated layer and form a PASC coating.

Figure 1A:
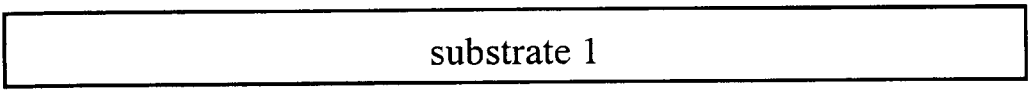
FIGS. 1A–1C show a method of forming a PASC coating on a substrate.
Figure 1B:
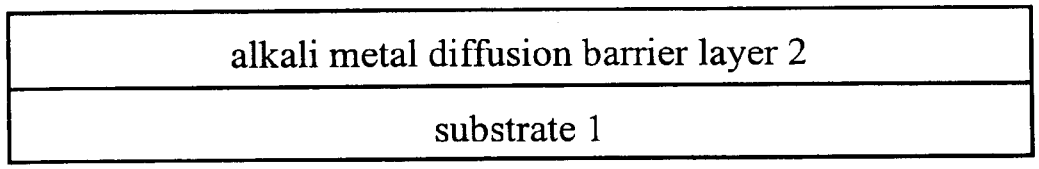
Figure 1C:
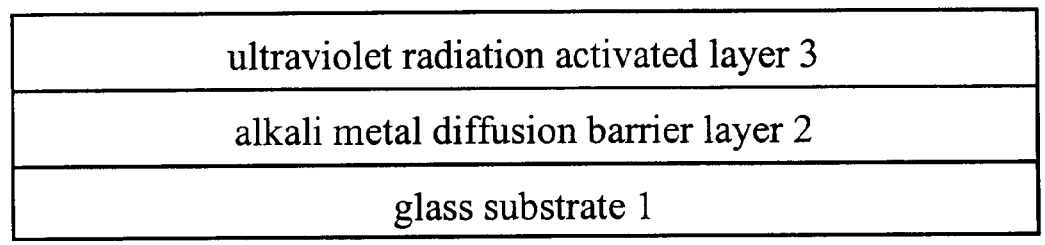

FIGS. 1A–1C illustrate embodiments of the invention. In FIG. 1A a substrate 1 to be coated with a PASC coating is provided. The substrate can be a metal, a semiconductor, or an insulator. Suitable materials for the substrate include various polymers, ceramics and glasses. Preferably, the substrate is at least partially transparent to visible radiation. Suitable transparent substrates include soda-lime-silica glasses and borosilicate glasses. Preferably, the glass is in the form of a flat sheet. Suitable glass sheet substrates include glass coated with one or more layers of various materials designed, e.g, to reduce infrared emissivity, or to alter visible transmittance and reflectance.

FIG. 1B shows an alkali metal diffusion barrier layer 2 that has been chemically vapor deposited on the substrate 1. The alkali metal diffusion barrier layer inhibits the diffusion of alkali metals, such as sodium (Na), from the substrate. Chemical vapor deposition is a technique well known in the art and will not be discussed in detail here. See, for example, U.S. Pat. Nos. 4,187,336; 4,828,880; and 6,103,363. Chemical vapor deposition uses thermochemical vapor-phase reactions to form thin solid film. The alkali metal diffusion barrier layer is deposited by chemical vapor deposition at a temperature above 350° C., preferably from 400 to 800° C. The alkali metal diffusion barrier layer can be from 10 to 500 nm thick, preferably from 60 to 300 nm thick. The alkali metal diffusion barrier layer can include one or more of silicon oxycarbide, oxides of silicon, oxides of tin, oxides of titanium, and oxides of aluminum. The oxides forming the alkali metallic diffusion barrier layer can include sub-oxides, stoichiometric oxides and super-oxides. In embodiments, the alkali metal diffusion barrier layer can include a plurality of different sublayers. For example, the alkali metal diffusion barrier layer can include a sublayer of a silicon oxycarbide (e.g., SiOC) on the substrate and a sublayer of a tin oxide (e.g., $SnO_2$) on the silicon oxycarbide. Doping a sublayer with, e.g, fluorine can provide infrared reflectivity.

FIG. 1C shows an ultraviolet radiation activated layer 3 that has been sputtered on the alkali metal diffusion barrier layer 2. Sputtering is a deposition technique well known in the art and will not be described in detail here. Sputtering involves applying a DC or AC (e.g., RF) voltage to a target in an atmosphere so that charged particles are created that strike the target, dislodging atoms which are subsequently deposited on a substrate. Preferably, the sputtering is magnetron sputtering involving the use of magnetic fields to increase sputter deposition rates. The sputtering can be carried out non-reactively, in an inert gas atmosphere, so that atoms from the sputtering gas are not included with the target atoms in the film deposited on the substrate. The sputtering can also be carried out reactively, in an atmosphere containing a reactive gas such as oxygen ($O_2$), so that the film deposited on the substrate contains both atoms of the reactive gas and atoms of the target. Preferably, the reactive sputtering atmosphere has an inert gas to $O_2$ ratio of from 2.95:1 to 1.78:1. In both non-reactive and reactive sputtering, preferably the inert gas is argon.

According to the present invention, the ultraviolet radiation activated layer is sputter deposited at a temperature of 100° C. or less, preferably 70° C. or less. However, the ultraviolet radiation activated layer is not intentionally heated by a conventional heating device, such as a resistive heater, during the sputter deposition. Instead, the ultraviolet radiation activated layer is sputter deposited at a deposition temperature induced primarily by exposure to the sputtering plasma. As is well known in the art, the plasma created in a sputtering process can heat a sputtered film to a temperature as high as about 100° C. depending upon the details of the sputtering process, such as power dissipation, target-substrate distance, etc. The term "plasma-induced temperature" as used herein refers to the deposition temperature of an ultraviolet radiation activated layer that results from sputtering the ultraviolet radiation activated layer in the absence of heating by a conventional heating device.

There is no lower limit for the sputter deposition temperature. However, because cooling the substrate during deposition is an unnecessary and uneconomical step, preferably, the ultraviolet radiation activated layer is sputtered at an initial deposition temperature of no less than ambient room temperature (e.g., 20–25° C.).

The ultraviolet radiation activated layer is a semiconductor layer that is activated upon exposure to UV radiation to form an activated PASC coating characterized by the ability to shed dirt simply upon rinsing with water. The ultraviolet radiation activated layer can include one or more of oxides of titanium, oxides of zinc, oxides of iron, oxides of silver, oxides of copper, oxides of tungsten, oxides of tin, oxides of bismuth, strontium titanate and mixtures thereof. The oxides in the ultraviolet radiation activated layer can include sub-oxides, stoichiometric oxides, and super-oxides. In embodiments, the ultraviolet radiation activated layer includes one or more of $TiO_2$, ZnO, $Fe_2O_3$, $WO_3$, $SnO_2$, $Bi_2O_3$ and $SrTiO_3$. Preferably, the ultraviolet radiation activated layer includes titanium oxide. Preferably, the titanium oxide includes $TiO_2$. The titanium oxide can include amorphous, rutile and anatase phases of titanium oxide, or a mixture of two or more of these phases.

The ultraviolet radiation activated layer can be from 1 to 250 nm, preferably from 14 to 20 nm, thick. If the ultraviolet radiation activated layer is less than 1 nm thick, then the physical integrity of the PASC coating can be easily compromised. If the ultraviolet radiation activated layer is more than 250 nm thick, then the optical characteristics, such as visible transmittance and reflectivity, tend to be compromised.

After sputter deposition, the ultraviolet radiation activated layer is maintained at a temperature of 100° C. or less, preferably 70° C. or less, more preferably at ambient room temperature (e.g., 20–25° C.), until activated by exposure to UV radiation.

The ultraviolet radiation activated layer is activated by exposure to UV radiation to become self-cleaning. This UV activation is most easily accomplished by exposure to sunlight. For example, a glass substrate coated with the alkali metal diffusion barrier layer and ultraviolet radiation activated layer can be activated by installing the glass and exposing the installed glass to sunlight for several days. The exposure to UV radiation forms electron-hole pairs in the semiconducting ultraviolet radiation activated layer. The UV radiation can have a wavelength in a range of from 10 to 400 nm, preferably from 300 to 400 nm. UV radiation having a wavelength of 350 to 400 nm is particularly suitable for activating $TiO_2$. The ultraviolet radiation activated layer can generally be activated with a minimum dose of UV radiation in a range of from about 0.001 to 1 mW/cm$^2$, which is readily available from normal sunlight.

Surprisingly, the present invention forms coatings with self-cleaning characteristics without heat treating the ultraviolet radiation activated layer during or after deposition as is conventionally required. Instead, the present invention achieves a coating with self-cleaning characteristics after UV irradiation by chemical vapor deposition of an alkali metal diffusion barrier layer followed by sputter deposition of the ultraviolet radiation activated layer without intentionally heating the ultraviolet radiation activated layer during or after sputter deposition. The inventive sequential combination of chemical vapor deposition and sputtering eliminates the need for heat treatment of the ultraviolet radiation activated layer during and/or after deposition conventionally required to form coatings with self-cleaning characteristics.

The surprising ability according to the present invention to form self-cleaning coatings upon UV irradiation through the combination of chemical vapor deposition and sputtering, without intentionally heating the ultraviolet radiation activated layer during or after deposition, is at present unexplained. This ability to form self-cleaning coatings by sequential chemical vapor deposition and sputtering is surprising because one skilled in the art would expect that the composition of the ultraviolet radiation activated layer, and not the specific methods used to deposit the ultraviolet radiation activated layer and the underlying alkali metal diffusion barrier layer, would dictate the self-cleaning properties of the coatings upon UV activation. In addition, the skilled artisan would expect that a heat treatment process of some kind would be required to recrystallize thin layers of titanium oxide to a primarily anatase structure in order to achieve hydrophilic/photocatalytic characteristics.

EXAMPLES

Example 1

The self-cleaning characteristics achieved in activated PASC coatings formed according to the present invention are reflected in the contact angle of water on the coatings. Table I compares, after identical UV activation, the contact angle of deionized water on an inventive bilayer coating of sputtered $TiO_2$ on chemically vapor deposited $SiO_2$ with a comparative bilayer coating of sputtered $TiO_2$ on sputtered $SiO_2$ and a comparative bilayer coating of CVD $TiO_2$ on CVD $SiO_2$.

Figure 2:
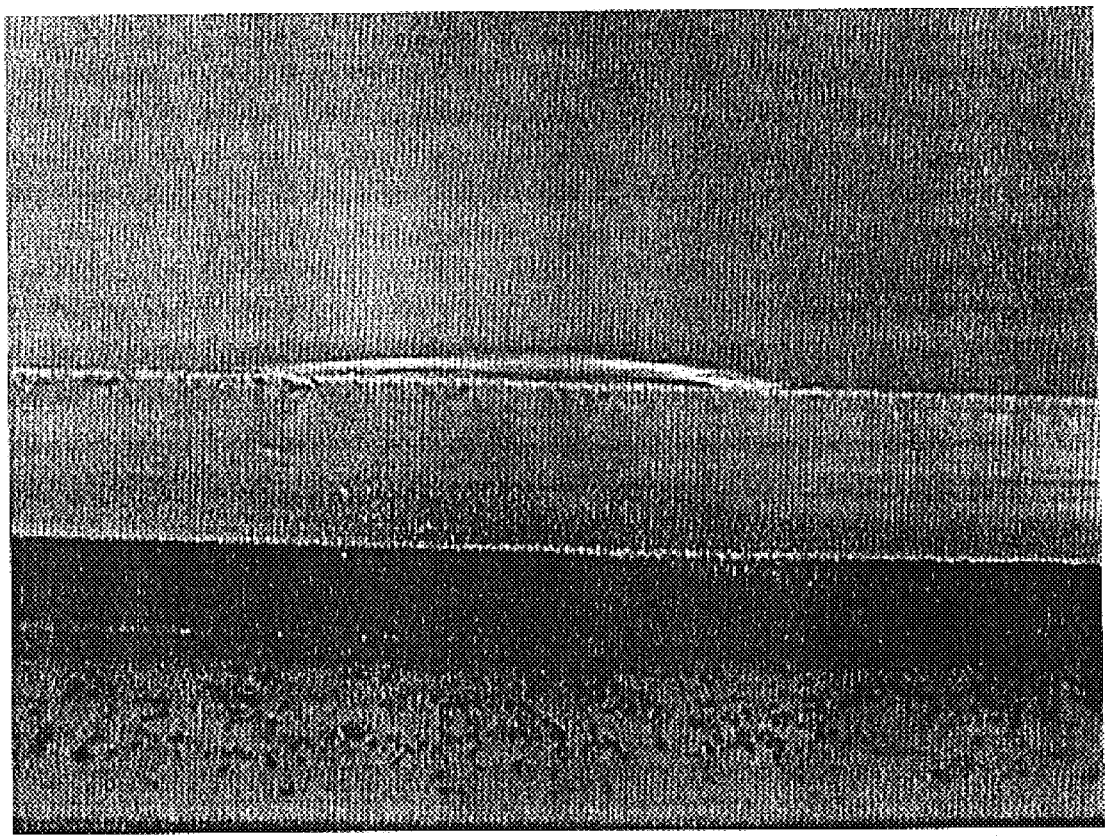
FIG. 2 is a photograph of a deionized water droplet on an inventive UV activated PASC coating of sputtered $TiO_2$ on CVD $SiO_2$.

FIG. 2 is a photograph of a deionized water droplet on an inventive UV activated PASC coating of sputtered $TiO_2$ on CVD $SiO_2$.

Figure 3:
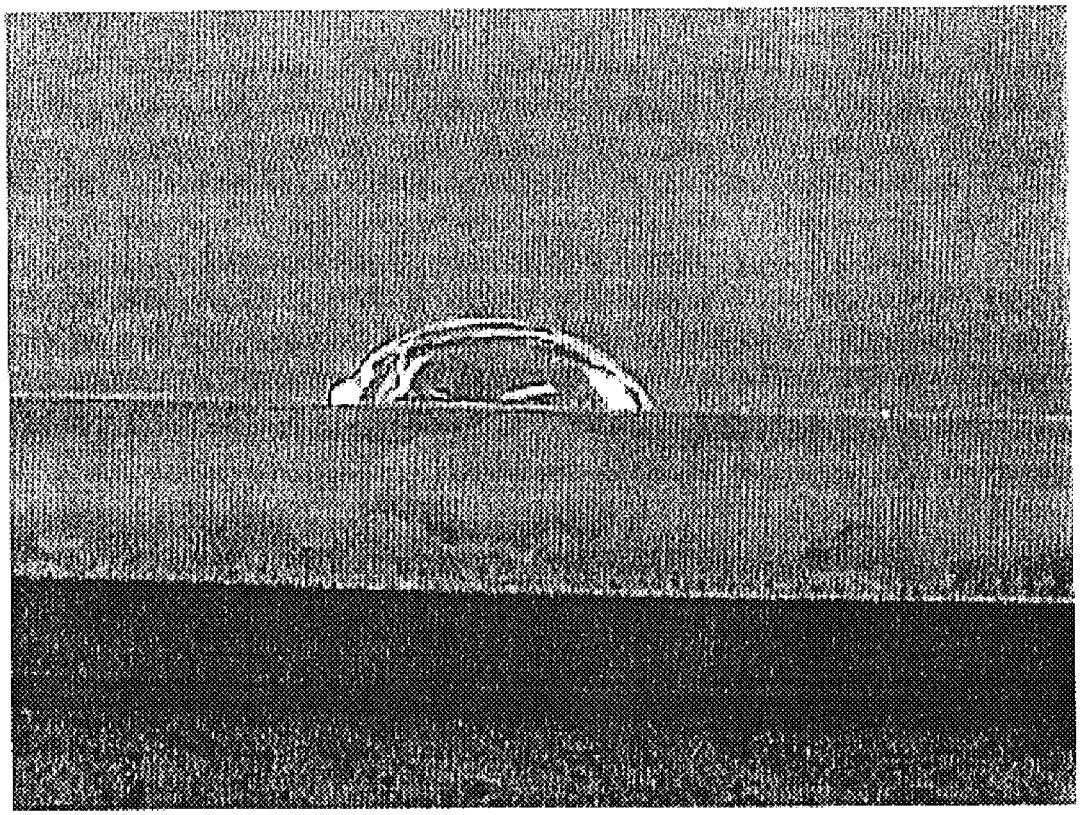
FIG. 3 is a photograph of a deionized water droplet on a comparative coating of UV activated sputtered $TiO_2$ on sputtered $SiO_2$.

FIG. 3 is a photograph of a deionized water droplet on a comparative coating of UV activated sputtered $TiO_2$ on sputtered $SiO_2$.

Figure 4:
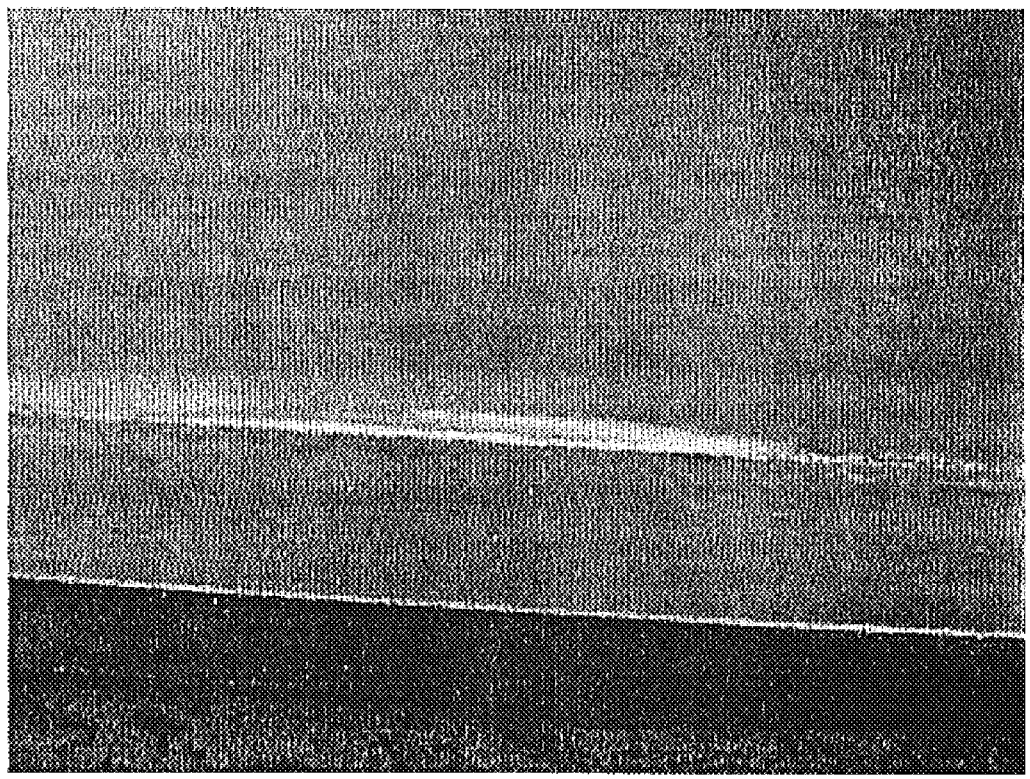
FIG. 4 is a photograph of a deionized water droplet on a comparative coating of UV activated CVD $TiO_2$ on CVD $SiO_2$.

FIG. 4 is a photograph of a deionized water droplet on a comparative coating of UV activated CVD $TiO_2$ on CVD $SiO_2$.

The sputtered $TiO_2$ layers were sputtered under the same conditions of AC magnetron sputtering from a titanium target in an argon-oxygen atmosphere containing about 35% $O_2$. The CVD $TiO_2$ was chemically vapor deposited at a temperature of 600° C. from precursors including titanium tetrachloride. The $TiO_2$ layers were 20 nm thick. The sputtered $TiO_2$ layers were not intentionally heated during or after the sputter deposition. The $SiO_2$ layers were 30 nm thick. The sputtered $SiO_2$ layer was formed by AC magnetron sputtering from a silicon target in an argon-oxygen atmosphere containing about 50% $O_2$. The CVD $SiO_2$ was deposited at 700° C. from precursors including silane.

Table I shows that under these conditions chemical vapor deposition of $SiO_2$ on a substrate followed by sputter deposition of $TiO_2$ without heat treatment during or after the sputter deposition results in a smaller water contact angle on $TiO_2$, and hence improved self-cleaning characteristics, than sputter deposition of both the $SiO_2$ and the $TiO_2$ without heat treatment during or after the sputter deposition.

Table I also shows that under these conditions chemical vapor deposition of $SiO_2$ on a substrate followed by sputter deposition of $TiO_2$ without heat treatment during or after the sputter deposition results in about the same water contact angle on $TiO_2$, and hence about the same self-cleaning characteristics, as chemical vapor deposition of both the $SiO_2$ and the $TiO_2$.

TABLE I

| COATING | CONTACT ANGLE OF WATER ON UV ACTIVATED $TiO_2$ |
|---|---|
| sputtered $TiO_2$ on CVD $SiO_2$ (Invention) | 4 to 7 degrees |
| sputtered $TiO_2$ on sputtered $SiO_2$ (Comparative) | 50 to 60 degrees |
| CVD $TiO_2$ on CVD $SiO_2$ (Comparative) | 4 to 7 degrees |

Example 2

Figure 5:
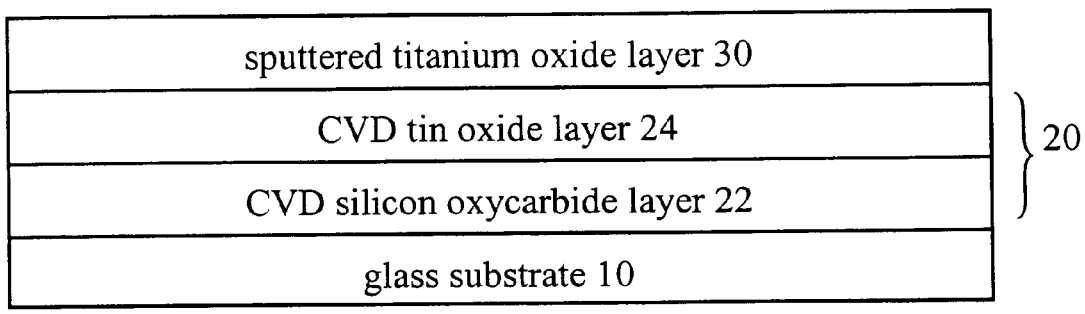
FIG. 5 shows a PASC coating on a substrate.

FIG. 5 illustrates an embodiment of the invention in which a soda-lime-silica glass substrate 10 is coated with a low-emissivity coating 20 of, in order, a CVD silicon oxycarbide layer 22 and a CVD fluorine-doped tin oxide layer 24. On the low-emissivity coating 20 is a sputtered titanium oxide layer 30, which acquires self-cleaning characteristics upon UV irradiation.

The CVD silicon oxycarbide layer 22 and the CVD fluorine-doped tin oxide layer 24 inhibit the diffusion of alkali metals and together form an alkali metal diffusion barrier layer. The silicon oxycarbide layer 22 is 70 nm thick and is deposited by chemical vapor depostion on the glass substrate 10 at 700° C. from precursors including silane. In addition to inhibiting the diffusion of alkali metal from the glass substrate 10, the silicon oxycarbide layer 22 serves as a color suppressing layer. The fluorine-doped tin oxide layer 24 is 270 nm thick and is deposited by chemical vapor deposition on the glass substrate 10 at 600° C. from precursors including monobutyltintrichloride. The tin oxide layer 24 is doped with fluorine to lower sheet resistance so that the tin oxide layer 24 can serve as an infrared radiation reflective layer of the low-emissivity glass coating 20. The combination of silicon oxycarbide and fluorine-doped tin oxide results in both color neutrality and infrared reflectivity.

The titanium oxide layer 30 is 20 nm thick and is formed by AC magnetron sputtering a titanium metal target in an argon atmosphere containing about 35% $O_2$ with the glass substrate 10 initially at room temperature. The sputter deposition rate in a dynamic sputter chamber is about 3.5 nm/(m/min).

To demonstrate the self-cleaning properties of the coated substrate, stearic acid ($CH_3(CH_2)_{16}COOH$), as a model organic contaminant, is coated on the titanium oxide layer 30 after UV activation. After the titanium oxide layer 30 is further exposed to UV irradiation in sunlight for 48 to 80 hours, Fourier transform infrared (FTIR) spectroscopy shows that the stearic acid is no longer present on the titanium oxide layer 30.

Example 3

PASC coatings are made by AC magnetron sputtering a 20 nm thick $TiO_2$ coating from a titanium target in an argon atmosphere containing about 35% $O_2$ under identical conditions onto a 35 nm thick CVD SiOC layer, a 120 nm thick CVD fluorine-doped $SnO_2$ (i.e., $SnO_2$:F) layer, and a bilayer of a 270 nm thick CVD fluorine-doped $SnO_2$ layer on a 70 nm thick CVD SiOC layer. The CVD SiOC layer is deposited at a temperature of 700° C. from precursors including silane. The CVD fluorine-doped $SnO_2$ layer is deposited at a temperature of 600° C. from precursors including monobutyltintrichloride. The $TiO_2$ layers are not intentionally heated during or after the sputtering. The $TiO_2$ layers are activated by exposure to 2 $W/m^2$ of 350 to 400 nm UV radiation for 48 to 72 hours.

Figure 6:
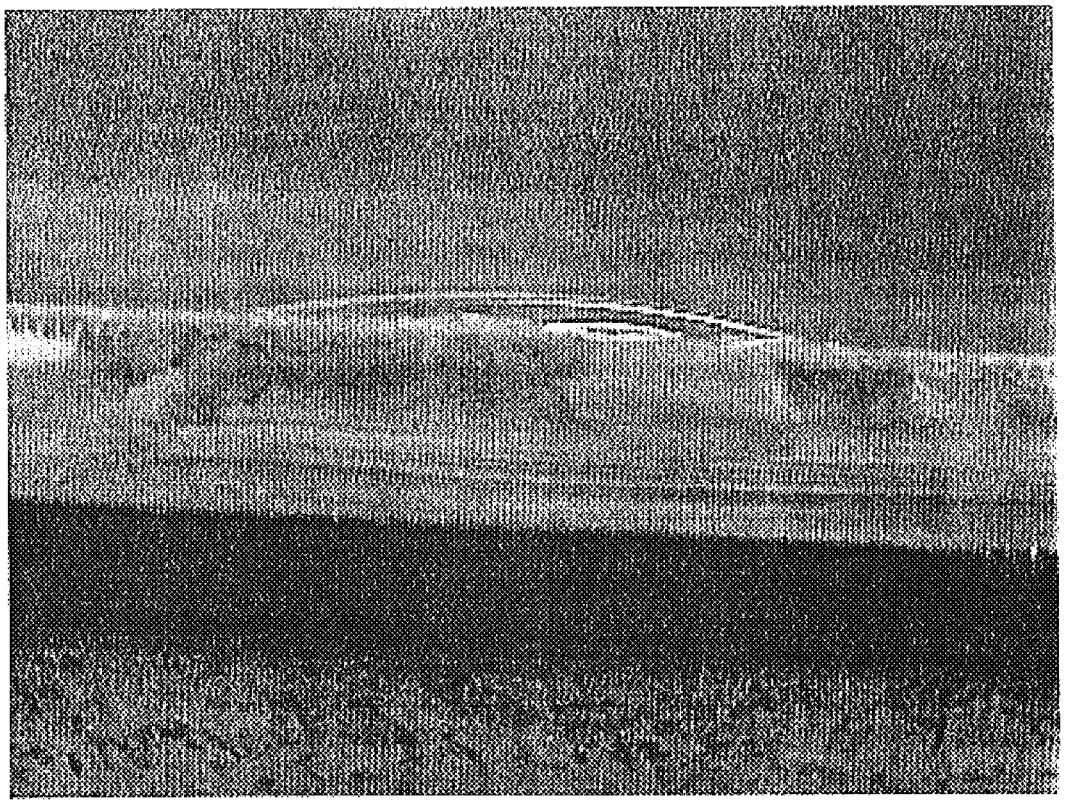
FIG. 6 is a photograph of a deionized water droplet on an inventive UV activated PASC coating of sputtered $TiO_2$ on CVD SiOC.

FIG. 6 is a photograph of a deionized water droplet on an inventive UV activated PASC coating of sputtered $TiO_2$ on CVD SiOC.

Figure 7:
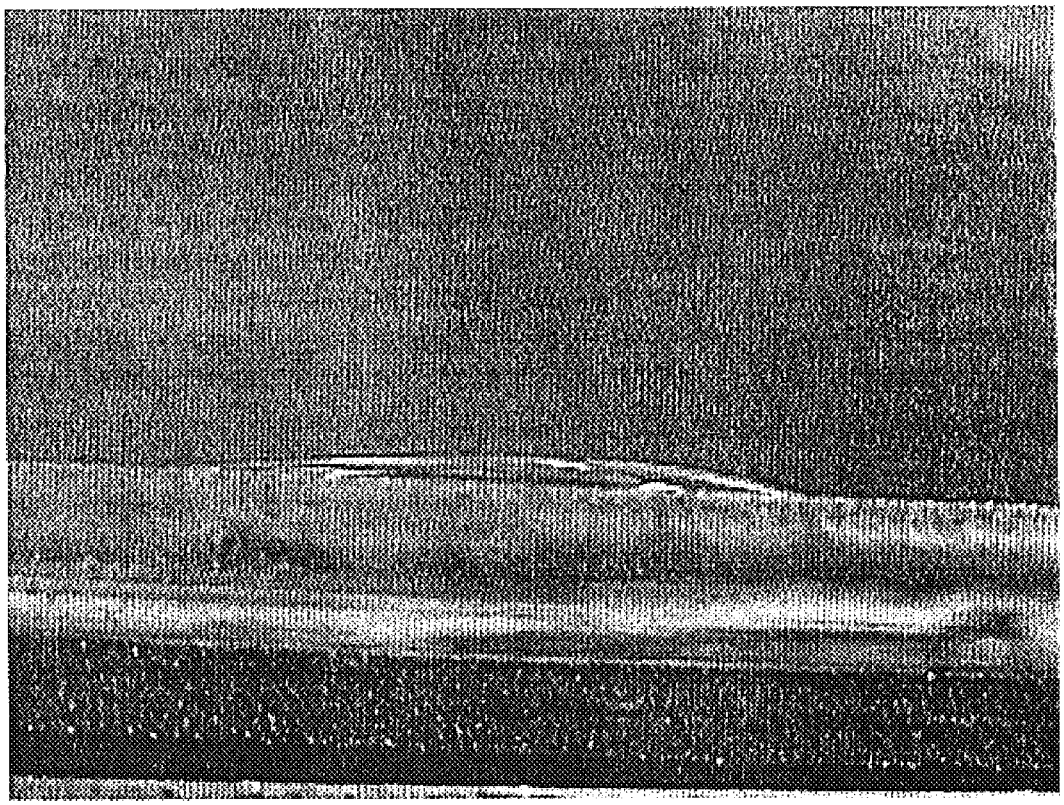
FIG. 7 is a photograph of a deionized water droplet on an inventive UV activated PASC coating of sputtered $TiO_2$ on the outermost bilayer of CVD $SnO_2$:F on CVD SiOC of a low-emissivity coating.

FIG. 7 is a photograph of a deionized water droplet on an inventive UV activated PASC coating of sputtered $TiO_2$ on the outermost bilayer of CVD $SnO_2$:F on CVD SiOC of a low-emissivity coating.

Table II compares the contact angle of deionized water on the activated $TiO_2$ for each of the coatings. Table II shows that activated sputtered $TiO_2$ deposited without intentional heating onto various CVD barrier layers exhibits strong hydrophilic characteristics regardless of the number and composition of the CVD barrier layers. Table II also shows that activated sputtered $TiO_2$ deposited without intentional heating onto a CVD barrier layer is always substantially more hydrophilic than activated sputtered $TiO_2$ deposited onto a sputtered barrier layer of $SiO_2$.

TABLE II

| COATING | CONTACT ANGLE OF WATER ON UV ACTIVATED $TiO_2$ |
|---|---|
| sputtered $TiO_2$ on CVD SiOC (Invention) | 4 to 7 degrees |
| sputtered $TiO_2$ on CVD $SnO_2$:F (Invention) | 4 to 7 degrees |
| sputtered $TiO_2$ on CVD $SnO_2$:F on CVD SiOC (Invention) | 4 to 7 degrees |
| sputtered $TiO_2$ on sputtered $SiO_2$ (Comparative) | 50 to 60 degrees |

While the present invention has been described with respect to specific embodiments, it is not confined to the specific details set forth, but includes various changes and modifications that may suggest themselves to those skilled in the art, all falling within the scope of the invention as defined by the following claims.

What is claimed is:

1. A method of making a self-cleaning substrate, the method comprising depositing by chemical vapor deposition an alkali metal diffusion barrier layer on a substrate;

sputtering an ultraviolet radiation activated layer on the alkali metal diffusion barrier layer at a temperature of 100° C. or less; and, without heating above 100° C., exposing the ultraviolet radiation activated layer to ultraviolet radiation to form the self-cleaning substrate.

2. The method according to claim 1, wherein the substrate is transparent to visible radiation.

3. The method according to claim 1, wherein the substrate comprises a glass.

4. The method according to claim 1, wherein the alkali metal diffusion barrier layer has a thickness in a range of from 10 to 500 nm.

5. The method according to claim 1, wherein the alkali metal diffusion barrier layer is deposited at a temperature above 350 ° C.

6. The method according to claim 1, wherein the alkali metal diffusion barrier layer is deposited at a temperature in a range of from 400 to 800 ° C.

7. The method according to claim 1, wherein the alkali metal diffusion barrier layer comprises a material selected from the group consisting of silicon oxycarbide, oxides of tin, oxides of titanium, oxides of aluminum, and mixtures thereof.

8. The method according to claim 1, wherein the alkali metal diffusion barrier layer comprises a bilayer including a layer of silicon oxycarbide and a layer of tin oxide; and the depositing comprises forming the layer of silicon oxycarbide on the substrate, and forming the layer of tin oxide on the layer of silicon oxycarbide.

9. The method according to claim 1, wherein the sputtering comprises magnetron sputtering a target in an atmosphere comprising an inert gas.

10. The method according to claim 9, wherein the target comprises titanium.

11. The method according to claim 9, wherein the inert gas is argon.

12. The method according to claim 9, wherein the atmosphere further comprises $O_2$; and a ratio of the inert gas to the $O_2$ is from 2.95:1 to 1.78:1.

13. The method according to claim 1, wherein the ultraviolet radiation activated layer is sputtered at a temperature of 70° C. or less; and the ultraviolet radiation activated layer is exposed to ultraviolet radiation without heating above 70° C.

14. The method according the claim 1, wherein the ultraviolet radiation activated layer comprises a member of the group consisting of oxides of titanium, oxides of zinc, oxides of iron, oxides of silver, oxides of copper, oxides of tungsten, oxides of tin, oxides of bismuth, strontium titanate, and mixtures thereof.

15. The method according to claim 1, wherein the ultraviolet radiation activated layer comprises a member of the group consisting of $TiO_2$, ZnO, $Fe_2O_3$, $WO_3$, $SnO_2$, $Bi_2O_3$, and $SrTiO_3$.

16. The method according to claim 1, wherein the ultraviolet radiation activated layer comprises titanium oxide.

17. The method according to claim 1, wherein the ultraviolet radiation activated layer is from 1 to 250 nm thick.

18. The method according to claim 1, wherein the ultraviolet radiation activated layer is exposed to ultraviolet radiation having a wavelength in a range of from 300 to 400 nm.

19. The method according to claim 1, wherein the ultraviolet radiation activated layer is exposed to ultraviolet radiation in sunlight.

20. A method of making a self-cleaning substrate, the method comprising depositing by chemical vapor deposition an alkali metal diffusion barrier layer on a substrate;

sputtering an ultraviolet radiation activated layer on the alkali metal diffusion barrier layer; and exposing the ultraviolet radiation activated layer to ultraviolet radiation to form the self-cleaning substrate, wherein the sputtering heats the ultraviolet radiation activated layer to a plasma-induced temperature; and the ultraviolet radiation activated layer is maintained at or below the plasma-induced temperature until the self-cleaning substrate is formed.

21. The method according to claim 20, wherein the plasma-induced temperature is 100° C. or less.

22. The method according to claim 20, wherein the plasma-induced temperature is 70° C. or less.

23. A method of making a self-cleaning substrate, the method comprising a step for depositing by chemical vapor deposition an alkali metal diffusion barrier layer on a substrate;

a step for sputtering an ultraviolet radiation activated layer on the alkali metal diffusion barrier layer at a temperature of 100° C. or less; and, without heating above 100° C., a step for exposing the ultraviolet radiation activated layer to ultraviolet radiation to form the self-cleaning substrate.

* * * * *